United States Patent
DeNatale et al.

(10) Patent No.: US 7,906,404 B2
(45) Date of Patent: Mar. 15, 2011

(54) POWER DISTRIBUTION FOR CMOS CIRCUITS USING IN-SUBSTRATE DECOUPLING CAPACITORS AND BACK SIDE METAL LAYERS

(75) Inventors: Jeffrey DeNatale, Thousand Oaks, CA (US); Atul Joshi, Thousand Oaks, CA (US); Per-Olov Pettersson, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 139 days.

(21) Appl. No.: 12/276,043

(22) Filed: Nov. 21, 2008

(65) Prior Publication Data

US 2010/0127346 A1    May 27, 2010

(51) Int. Cl.
*H01L 21/71* (2006.01)
(52) U.S. Cl. ............. 438/386; 438/667; 257/E21.011
(58) Field of Classification Search .............. 438/386
See application file for complete search history.

(56) References Cited

U.S. PATENT DOCUMENTS

| | | | |
|---|---|---|---|
| 5,343,071 A * | 8/1994 | Kazior et al. ............. 257/621 |
| 6,355,950 B1 | 3/2002 | Livengood | |
| 6,565,730 B2 | 5/2003 | Chakravorty | |
| 6,717,071 B2 | 4/2004 | Chang | |
| 2008/0132038 A1 * | 6/2008 | Kameyama et al. .......... 438/465 |
| 2008/0258267 A1 * | 10/2008 | Nakashima .................. 257/621 |
| 2010/0001378 A1 * | 1/2010 | DeNatale et al. ............. 257/621 |
| 2010/0110607 A1 * | 5/2010 | DeNatale et al. ............. 361/311 |

* cited by examiner

*Primary Examiner* — Stephen W Smoot
(74) *Attorney, Agent, or Firm* — Koppel, Patrick, Heybl & Dawson

(57) ABSTRACT

A semiconductor device and method for fabricating the same is provided. The semiconductor device includes a substrate, at least one capacitor, an active circuit and a power plane. The substrate has a first cavity formed through a first surface to a first depth and a second cavity formed through a second surface to a second depth. The first and second cavities forming a via hole through the substrate. The at least one capacitor includes a first conductive material layer deposited in the via hole, a first isolation material layer deposited over the first conductive material layer, and a second conductive material layer deposited over the first isolation material layer. The active circuit adjacent the first surface and electrically coupled to the at least one capacitor, and the power plane adjacent the second surface and electrically coupled to the at least one capacitor to provide power conditioning to the active circuit.

13 Claims, 5 Drawing Sheets

POWER DISTRIBUTION FOR CMOS CIRCUITS USING IN-SUBSTRATE DECOUPLING CAPACITORS AND BACK SIDE METAL LAYERS

BACKGROUND

This invention is directed to a power distribution system for semiconductor devices, and more particularly to a power distribution system using in-substrate decoupling capacitors and back side metal layers to provide power to CMOS circuits.

SUMMARY

The present invention provides power distribution for a semiconductor device using in-substrate decoupling capacitors and back side metal layers. The present invention also provides power distribution for a CMOS circuit that reduces a chip area needed for capacitance and metal layer routing on an active circuit layer of the CMOS circuit.

The foregoing and/or other aspects and utilities of the present invention may be achieved by providing a semiconductor device that includes a substrate, at least one capacitor, an active circuit and a power plane. The substrate may include a first and second surfaces and having a first cavity formed into the first surface to a first depth and a second cavity formed into the second surface to a second depth. The first cavity has a first perimeter and the second cavity has a second perimeter. The second perimeter may be greater than the first perimeter. The first and second cavities form a via hole through the substrate. The at least one capacitor may include a first conductive material layer, a first isolation material layer and a second conductive material layer. The first conductive material layer is deposited in the via hole such that the first conductive material layer may be electrically continuous across a length of the via hole. The first isolation material layer is deposited over the first conductive material layer and being electrically insulating, continuous and substantially conformal. The second conductive material layer deposited over the first isolation material layer such that the second conductive material layer may be electrically continuous across the length of the via hole. The active circuit adjacent the first surface and electrically coupled to the at least one capacitor, and the power plane adjacent the second surface and electrically coupled to the at least one capacitor to provide power conditioning to the active circuit.

In one embodiment, the semiconductor device may include a second isolation material layer between an inner surface of the via hole and the first conductive material layer, such that the at least one capacitor is electrically floating relative to the substrate. In another embodiment, the second conductive material layer may couple the active circuit to a power component of the power plane and the first conductive material layer may couple the active circuit to a ground component of the power plane. Conversely, the second conductive material layer may couple the active circuit to a ground component of the power plane and the first conductive material layer may couple the active circuit to a power component of the power plane.

The foregoing and/or other aspects and utilities of the present invention may also be achieved by providing a method for fabricating a semiconductor device with an in-substrate capacitor coupled to an active circuit layer and a power plane. The method includes forming an active circuit layer adjacent the first surface of the substrate and etching a first cavity through the active circuit layer and the first surface of the substrate to a first depth. The first cavity having a first perimeter. Next, etching a second cavity through the second surface of the substrate to a second depth. The second cavity having a second perimeter. The first and second cavities form a via hole through the substrate. Then, depositing a first conductive material layer in the via hole such that the first conductive material layer may be electrically continuous across a length of the via hole. A first isolation material layer may be deposited over the first conductive material layer. The isolation material layer may be electrically insulating, continuous and substantially conformal. Next, depositing a second conductive material layer over the isolation material layer such that the second conductive material layer may be electrically continuous across the length of the via hole. The first and second conductive material layers and the first isolation material layer forming the in-substrate capacitor. A power plane may be formed and/or disposed adjacent the second surface of the substrate. Next, electrically coupling the active circuit layer and the power plane to the in-substrate capacitor to provide power conditioning and distribution to the active circuit layer.

These and other features, aspects, and advantages of the present invention will become better understood with reference to the following drawings, description, and claims.

BRIEF DESCRIPTION OF THE DRAWINGS

The detailed description of embodiments of the invention will be made with reference to the accompanying drawings, wherein like numerals designate corresponding parts in the figures.

DETAILED DESCRIPTION

In the description that follows, the present invention will be described in reference to an embodiment that provides power distribution for CMOS circuits using in-substrate capacitors and back side metal layers. The present invention, however, is not limited to any particular application nor is it limited by the examples described herein. Therefore, the description of the embodiments that follow are for purposes of illustration and not limitation.

Figure 1:
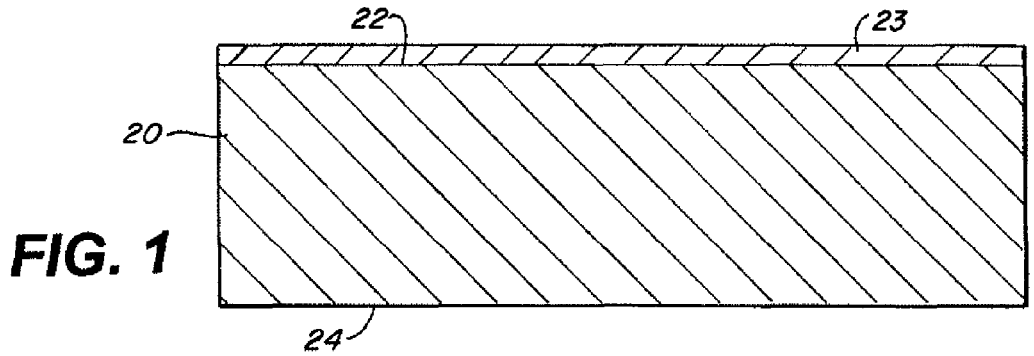
FIGS. 1-10 are sectional views of a fabrication process for forming high aspect ratio vertical capacitors, according to an embodiment of the present disclosure.

The present invention may be directed to power distribution for semiconductor devices using in-substrate decoupling capacitors and back side metal layers, and methods of fabricating the same. The basic process steps may be illustrated in the series of sectional views shown in FIGS. 1-10. In FIG. 1, a substrate 20 has a first surface 22 and a second surface 24. Circuitry may be disposed on first surface 22, on second surface 24, and/or between surfaces 22 and 24. As shown in FIG. 1, an active circuit layer 23 may be formed on and/or adjacent to the first surface 22. The substrate 20 may be made from any of a number of semiconductor material layers, including but not limited to, silicon, gallium arsenide or indium phosphide.

Fabricating a vertical capacitor per the present disclosure includes forming a via hole through substrate 20 and the active circuit layer 23. The through-substrate via may be formed by etching first and second cavities having different diameters into the active circuit layer 23 and surfaces 22 and 24, such that they form a continuous aperture. This process is described below, though other methods of forming a through-substrate via might also be used.

Figure 2:
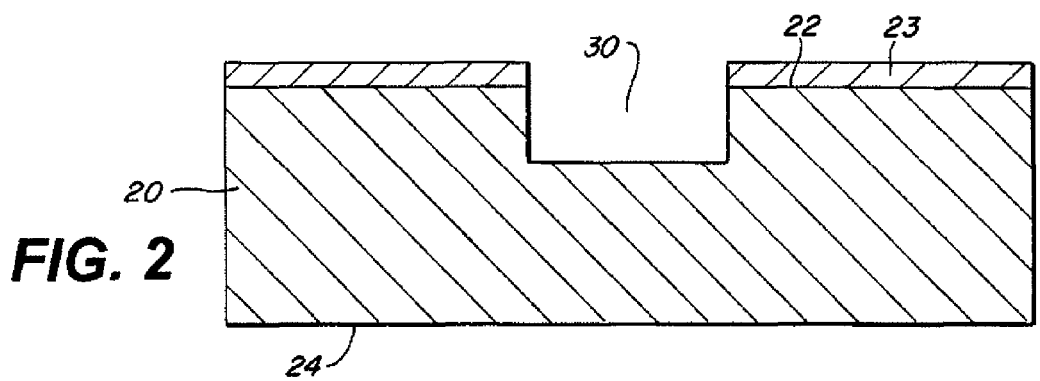
Figure 3:
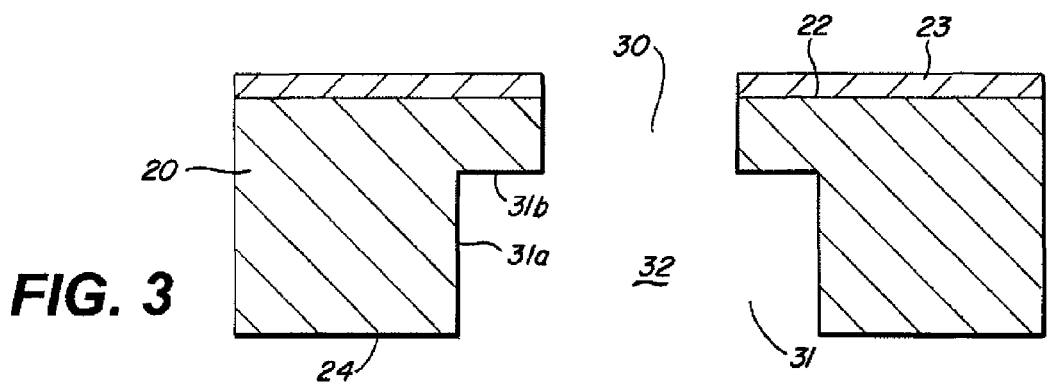

In FIG. 2, a first cavity 30 may be etched through the active circuit layer 23 and the first surface 22. The first cavity has a first perimeter (for example, if circular, having a first circumference with a first diameter), and extends a first depth into the substrate. The first perimeter may be chosen to minimize the consumed circuit area 23 on surface 22, and the first depth may be chosen to enable the first cavity 30 to extend below the depth of any active circuitry 23 on surface 22. Then, as shown in FIG. 3, a second cavity 31 having a second perimeter, may be etched coaxially with first cavity 30 through the second surface 24. The second cavity 31 may be etched to a second depth such that it communicates with first cavity 30 to form a continuous aperture or via hole 32 through the entire thickness of the substrate. The second cavity 31 may be defined by a vertical wall 31a and a horizontal wall 31b. In one embodiment, the first and second cavities 30, 31 may be extended to depths in the range of about 20 µm-200 µm and about 100 µm-350 µm, respectively, and have diameters of about 2 µm-8 µm and about 6 µm-25 µm, respectively. The larger diameter of the second cavity 31 enables a greater depth to be achieved at substantially the same aspect ratio. This enables the continuous aperture to extend through a greater total wafer thickness, while minimizing the consumed circuit area on surface 22 by the via 32.

The cavities may be formed by dry etching, for example, using a deep reactive ion etching process ("DRIE"). A DRIE process, such as the Bosch process, may be utilized for time-sequenced alternating etch and passivation steps. An etchant such as sulfur hexafluoride $SF_6$ may be used to etch a portion of the cavity into the substrate. To passivate the side wall of the cavity and prevent further lateral etching, an insulating layer may subsequently be deposited using a separate gas composition which includes a species such as octafluorocyclobutane $C_4F_8$. This process may be repeated until the desired depth is achieved. Etching via 32 using this process allows for high selectivity and achieves substantially vertical side walls, with aspect ratios as high as 40:1 or more. Such high aspect ratio may be used to facilitate the production of smaller diameter cavities and smaller via-to-via spacings, as it reduces the amount of lateral blooming during etching and reduces side wall scalloping.

Figure 4:
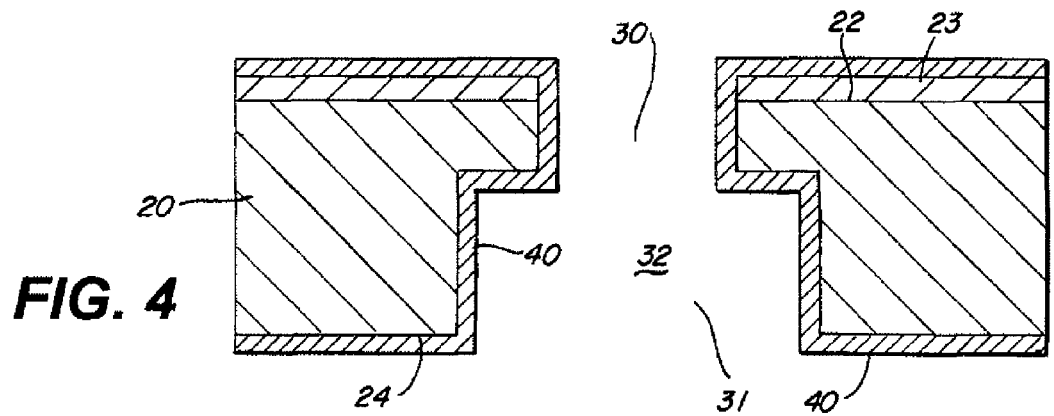

A vertical capacitor in accordance with the present invention can be 'floating' relative to the substrate, in which the capacitor's metal layers are isolated from substrate 20, or non-floating. If floating, the next step may be to deposit an isolation material layer 40 as shown in FIG. 4. Here, isolation material layer 40 may be selectively deposited onto substrate 20 and onto the interior walls of the aperture so as to provide an isolation material layer 40 that may be electrically insulating, continuous and substantially conformal. The uniform coverage of the sidewalls with isolation material layer 40 acts to electrically isolate the through-substrate via 32 from the substrate 20, as well as from other through-substrate vias being fabricated in substrate 20. Isolation material layer 40 may be formed by any of several methods, including thermal oxidation, plasma enhanced chemical vapor deposition (PECVD) or chemical vapor deposition (CVD), or atomic layer deposition (ALD).

The isolation material layer 40 may include, but not limited to, inorganic oxides capable of providing electrical insulation and conformal surface coatings, metal oxides, including the oxides of aluminum, titanium, tantalum, niobium, zirconium, hafnium, lanthanum, yttrium, cerium, silicon, scandium, chromium, and erbium.

ALD may be a gas phase chemical process used to create thin film coatings that are highly conformal and have extremely precise thickness control. ALD reactions may use two chemicals, typically called precursors, to react with a surface one-at-a-time in a sequential manner. By exposing the precursors to the growth surface repeatedly, a thin film may be deposited. Additional details about ALD can be found, for example, in "Surface Chemistry for Atomic Layer Growth", S. M. George et al., *J. Phys. Chem., Vol.* 100, No. 31 (1996), pp. 13121-13131.

Figure 5:
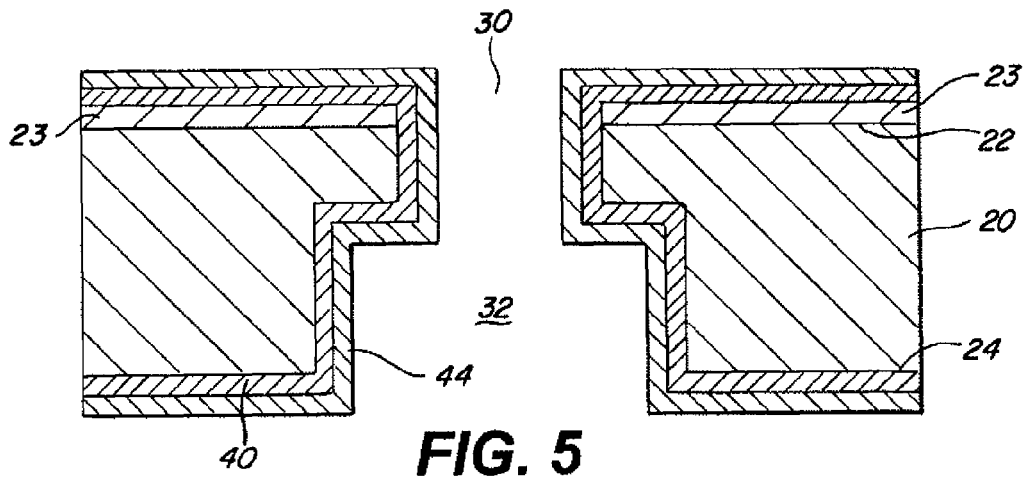

After the isolation material layer 40 (if used) has been deposited onto the substrate, a first conductive material layer 44 may be selectively deposited over the isolation material layer 40 such that the first conductive material layer 44 may be electrically continuous across the length of the via hole 32; this is shown in FIG. 5. If the capacitor is non-floating, the first conductive material layer 44 may be selectively deposited (not shown) on the interior walls of the via hole 32, such that layer 44, and thus one terminal of the capacitor, may be in contact with substrate 20 and therefore at ground potential. The conductive material layer 44 may include a material from nickel, palladium, platinum, ruthenium, tungsten, iridium, copper, molybdenum, gold, zinc oxide, and their respective alloys. In one embodiment, dry etching and ALD deposition steps for selectively depositing the first conductive layer 44 may be conducted at a temperature of less than about 200° C., such that the active circuit layer 23 residing on the substrate 20 may not be damaged by excessive heat.

In some cases, it may be desirable to 'activate' the isolation material layer 40 prior to the deposition of the first conductive material layer 44, to make the isolation material layer 40 more conducive to receiving the first conductive material layer 40. This may be accomplished by selectively depositing a seed layer (not shown) onto isolation material layer 40. The seed layer (not shown) may be a layer of palladium. Once isolation material layer 40 may be activated, the first conductive material layer 44 may be selectively deposited onto the activated isolation material layer 40.

Figure 6:
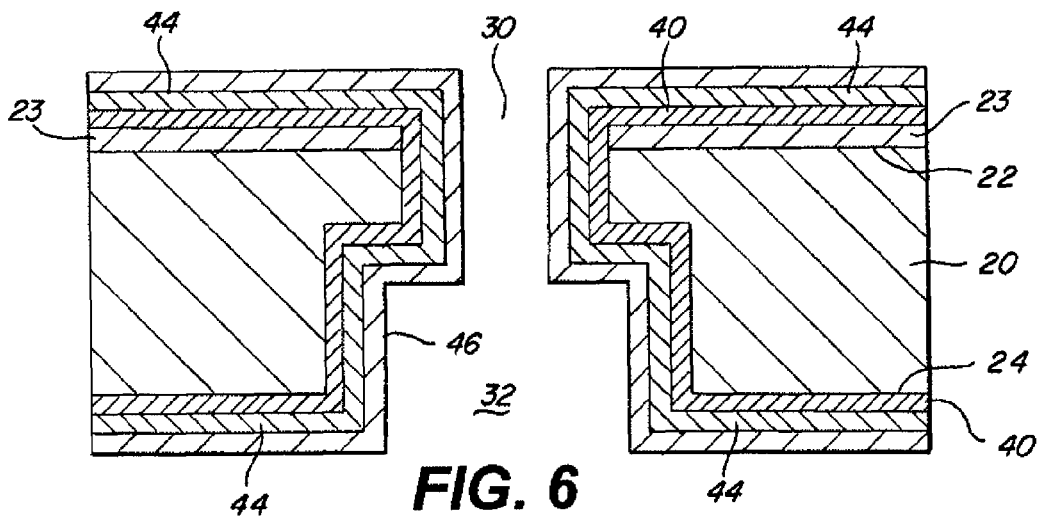

Next, another isolation material layer 46 may be selectively deposited over the first conductive material layer 44. The isolation material layer 46 may be used to serve as the capacitor's dielectric layer. As shown in FIG. 6, the isolation material layer 46 may be selectively deposited to form an electrically insulating, continuous and substantially conformal layer. The isolation material layer 46 may be made from a material with a high dielectric constant, such as hafnium oxide ($HfO_2$), to maximize the structure's capacitance for a given thickness of layer 46.

Figure 7:
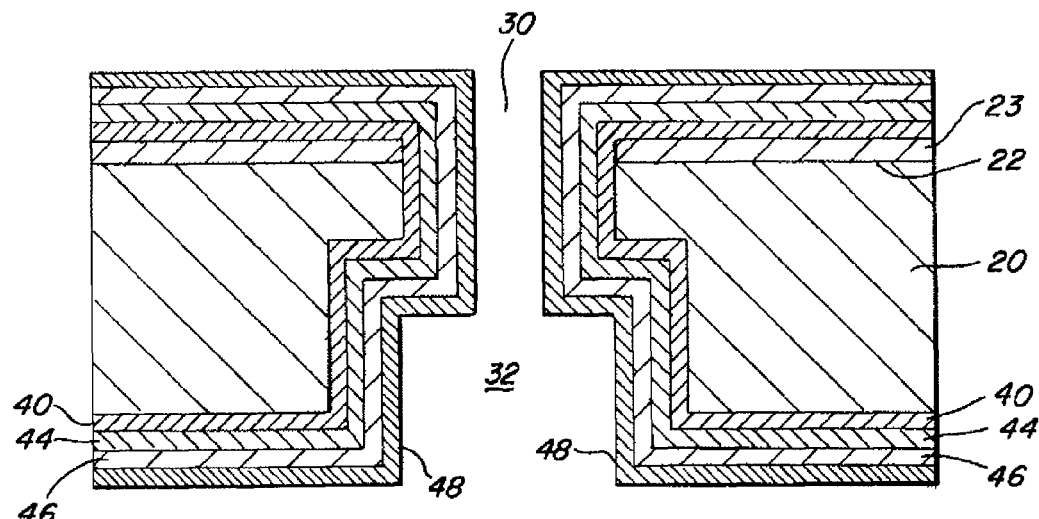

To provide the capacitor's second metal layer, a second conductive material layer 48 may be selectively deposited over the isolation material layer 46 such that the second conductive material layer 48 may be electrically continuous across the length of the via hole, as shown in FIG. 7. The second conductive material layer 48 may be formed from nickel, palladium, platinum, ruthenium, tungsten, iridium, copper and/or zinc oxide.

As described above, it may be desirable to 'activate' isolation material layer 46 prior to the deposition of the second conductive material layer 48, to make the isolation material layer 46 more conducive to receiving the second conductive material layer 48. This may be accomplished by depositing a seed layer (not shown) onto isolation material layer 46, for example, using ALD.

Figure 8:
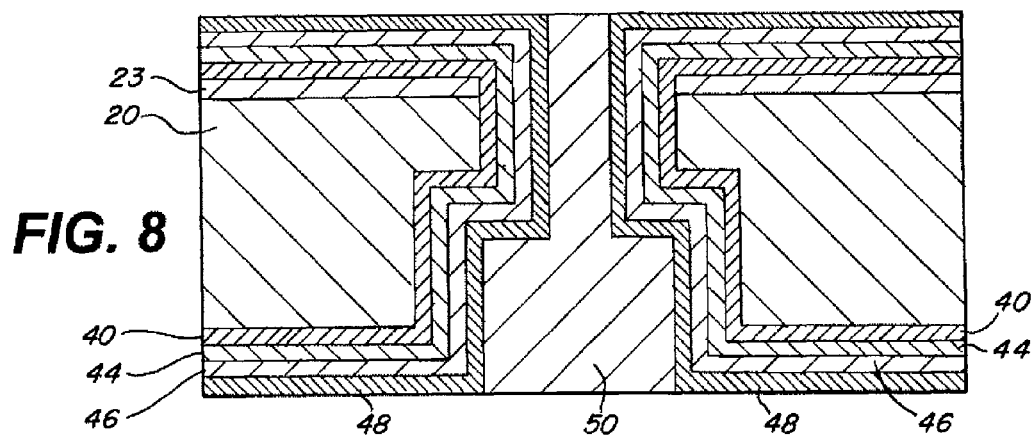

In one embodiment, any portions of cavities 30 and 31 which were not already filled by layers 40, 44, 46 and 48 may now be filled with a metal 50, as shown in FIG. 8. This hole filling may be done for two reasons. First, processing of the substrate 20 with the via hole 32 in it may be difficult because photoresist material layers may get sucked into the hole 32 by vacuum chucks, and air bubbles that get trapped in the hole 32 may pop and degrade the cosmetics of the subsequent surface pattern. Second, the second conductive material layer 48 may be a thin layer, and hence may have a relatively high resistance. As can be appreciated, the via hole 32 may be filled using a plating process—for example, an electrolytic plating or electroless plating of a material layer like nickel, gold, or copper. This reduces the resistance of the center metal conductor 50 and physically plugs the hole 32 to permit resist processing.

Figure 9:
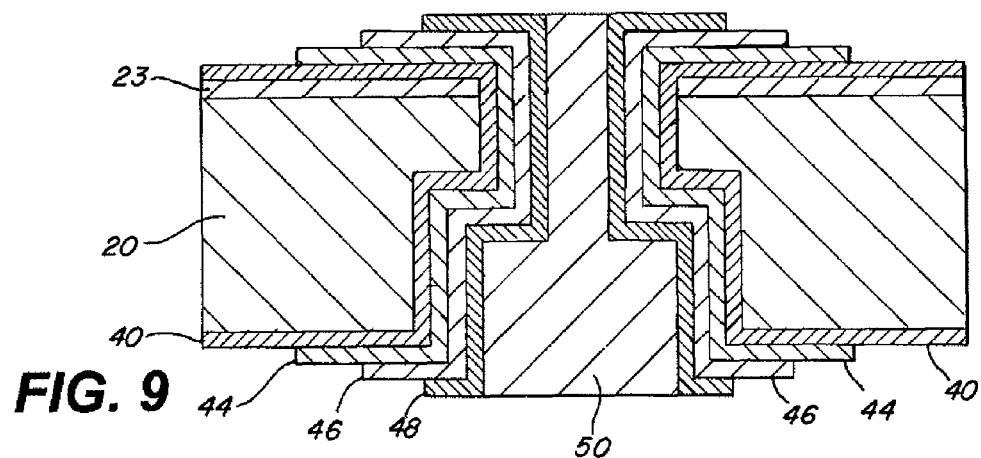
Figure 10:
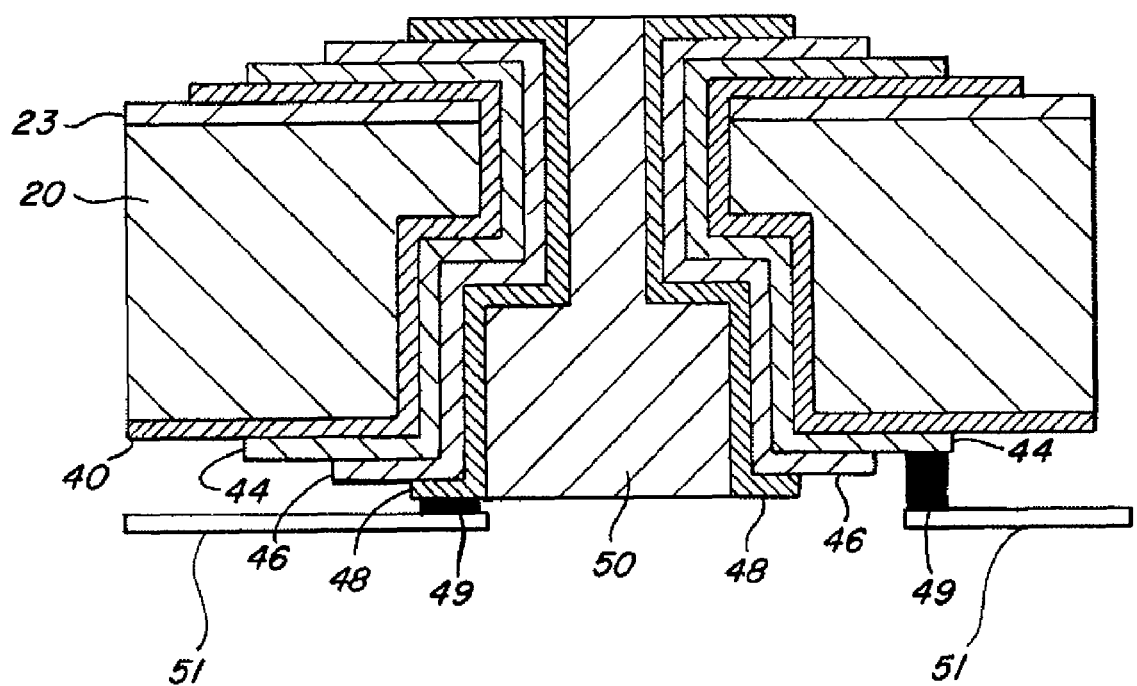

Additional processing and patterning may be performed to remove the isolation and conductive layers from areas where they are not needed, but leaving the completed vertical capacitor, as shown in FIG. 9. Next, a power plane 51 may be disposed adjacent the second surface 24 and electrically coupled, using for example a bump contact 49 or any other electrical interconnection known to a person skilled in the art, to capacitor plates 44, 48 to provide power conditioning and distribution to the active circuit layer 23, as shown in FIG. 10. The power plane 51 may include a power back plane electrically coupled to one conductive material layer 44 and a ground back plane electrically coupled to the other conductive material layer 48 of the vertical capacitor. Alternately, the power back plane may be patterned directly on the backside of the chip, with proper isolation layers, and interconnected to the supporting structure (package or board) through appropriate electrical interconnects.

Figure 11:
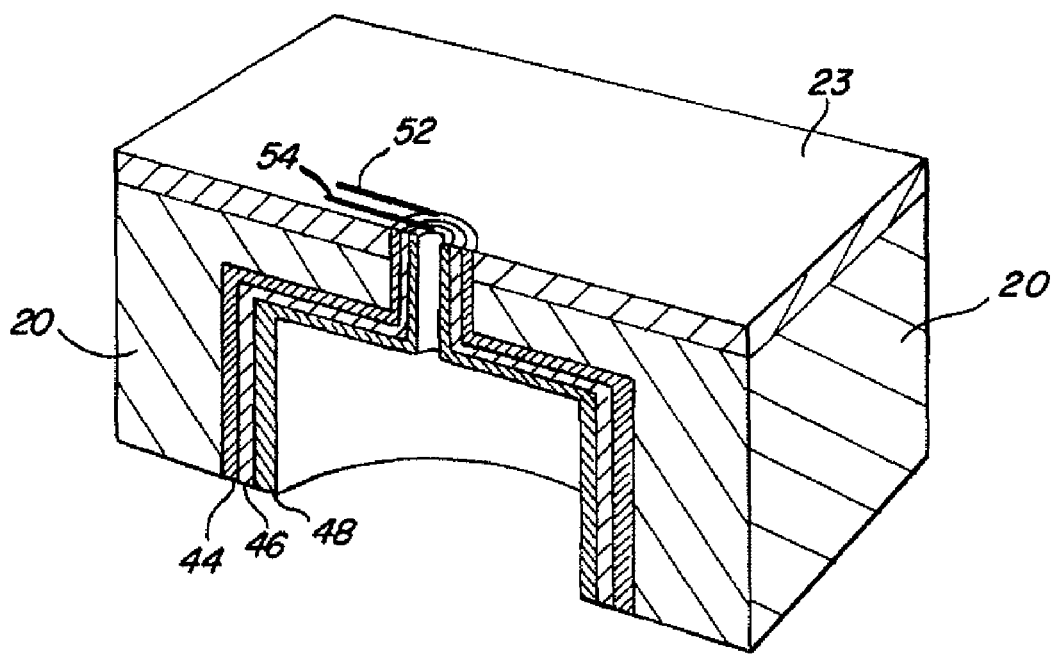
FIG. 11 illustrates a perspective view of a non-floating vertical capacitor, according to an embodiment of the present disclosure.

Likewise, the active circuit layer 23 may be coupled to the capacitor plates 44, 48, as shown in FIG. 11. In one embodiment, the second conductive material layer 48 may be used to couple the active circuit layer 23 to a power component of the power plane 51 and the first conductive material layer 44 may be used to couple the active circuit layer 23 to a ground component of the power plane 51. In another embodiment, the second conductive material layer 48 may be used to couple the active circuit layer 23 to a ground component of the power plane 51 and the first conductive material layer 44 may be used to couple the active circuit layer 23 to a power component of the power plane 51. Since one electrode of the vertical capacitor can be connected to a clean/quiet ground plane, the vertical capacitor can function as a decoupling capacitor to lessen the electrical noise in the power supply and provide additional power conditioning to the active circuit.

As can be appreciated, additional isolation material layers and conductive metal traces may be fabricated on surfaces 22 and/or 24 to route the electrical interconnection points to the desired locations on the surfaces. These process steps are not shown, since such fabrication techniques are well known to those skilled in semiconductor processing. FIG. 11 illustrates a perspective view of a non-floating vertical capacitor, according to an embodiment of the present disclosure. Electrical contacts, such as electrical contacts 52 and 54 may be added to facilitate connections between the active circuit layer 23 and the metal layers 44 and 48, respectively.

With the possible exception of the hole-filling step, the present method may be an all-dry process, thereby eliminating the possibility of liquid solution particulates clogging the through-substrate via 32. Wet processing techniques may be used in the final steps to plug the via 32, since at this stage the via may be isolated and electrically continuous across its length, and thus clogging due to solution particulates may not reduce the operability of via 32.

As can be appreciated, the present method enables high aspect ratio vertical capacitors to be fabricated in substrates 20 having a thickness of greater than 50 μm. For best performance, the conductive material layers 44, 48 may have a high conductivity, and the isolation material layers 40, 46 may have a high dielectric breakdown strength.

Additional techniques can be employed to further increase the capacitance that can be achieved by the present method. For example, extended etch patterns can be formed in the sidewalls of second cavity 31, such that the cavity's surface area—and thereby the structure's capacitance—may be increased. Another approach may be to vary the shape of the structure; for example, the capacitor's two metal layers 44, 48 and intervening dielectric layer 46 may be formed into a spiral shape, thereby providing more surface area and more capacitance.

The present process may be well-suited to use with a multi-layer stack of substrates, in which a substrate containing vertical capacitors as described herein may be bonded together with a plurality of additional substrates. The bonding between substrates may be effected with, for example, solder bumps, indium columns, Au—Au thermocompression bonding or glue. The bonding means provides a mechanical function, and can also provide an electrical function when the bonds effect electrical interconnections between individual substrate layers. Signals may be routed from one substrate to another through vias 32, as well as via the bonding means.

As can be appreciated, the vertical capacitor of the present disclosure may be used to reduce chip area needed for capacitance and metal layer routing. The capacitance may be about 625 fF per square micron of consumed silicon circuit area, which would be about 38 times the MOSFET gate capacitance of the prior art. One feature of the present disclosure is the availability of power and ground anywhere on the chip, thereby reducing the amount of metal layer routing needed for power distribution. Additionally, less noise on the power supply may occur due to decoupling capacitance of the vertical capacitor.

Although the foregoing described the invention with preferred embodiments, this is not intended to limit the invention. Indeed, embodiments of this invention can be combined with other circuit chips and systems. For instance, embodiments of the invention can be used for compact electronic circuits with multiple stacking layers and circuitry. Other uses include an enhanced three-dimensional electronic imager having wide dynamic range and pixel level image processing due to the density with which vertical capacitors can be fabricated on the wafer, RF filters, FPA ROICs, and 3D consumer electronics. Other applications include a vertically interconnected sensor array which provides signal processing in conjunction with infrared sensor systems, an arrayed acoustic sensing system, LADAR, and microprocessor circuits in which latency across the chip presents an issue.

As seen from the foregoing, substrates having high aspect ratio through-substrate vias 32 may be used as standalone substrates or in combination with other types of substrates or systems. In this regard, the foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

What is claimed is:

1. A method for fabricating a semiconductor device with an in-substrate capacitor coupled to an active circuit layer and a power plane, the substrate having a first surface and a second surface, the method comprising:
   forming an active circuit layer adjacent the first surface of the substrate;
   etching a first cavity through the active circuit layer and the first surface of the substrate to a first depth, the first cavity having a first perimeter;
   etching a second cavity through the second surface of the substrate to a second depth, the second cavity having a second perimeter, the first and second cavities forming a via hole through the substrate;
   depositing a first conductive material layer in the via hole such that the first conductive material layer is electrically continuous across a length of the via hole;
   depositing a first isolation material layer over the first conductive material layer, the isolation material layer being electrically insulating, continuous and substantially conformal;
   depositing a second conductive material layer over the isolation material layer such that the second conductive material layer is electrically continuous across the length of the via hole, the first and second conductive material layers and the first isolation material layer forming the in-substrate capacitor;
   forming a power plane adjacent the second surface of the substrate; and
   electrically coupling the active circuit layer and the power plane to the in-substrate capacitor to provide power conditioning and distribution to the active circuit layer.

2. The method of claim 1, wherein the in-substrate capacitor is a decoupling vertical capacitor.

3. The method of claim 1, further comprising forming a first electrical connection adjacent the first surface to couple the active circuit layer to the in-substrate capacitor.

4. The method of claim 1, further comprising forming a second electrical connection adjacent the second surface to couple the power plane to the in-substrate capacitor.

5. The method of claim 1, further depositing a second isolation material layer in the via hole prior to the step of depositing a first conductive material layer.

6. The method of claim 1, wherein the in-substrate capacitor is electrically floating relative to the substrate.

7. The method of claim 1, wherein the first and second cavities are cylindrical, the diameter of the first cylindrical cavity is smaller than the diameter of the second cylindrical cavity, and both cylindrical cavities have a substantially similar aspect ratio.

8. The method of claim 1, wherein the first and second cavities form a single continuous aperture through the substrate.

9. The method of claim 1, wherein the second perimeter is greater than the first perimeter.

10. The method of claim 1, wherein the first cavity comprises a first cylindrical cavity with a first diameter, the second cavity comprises a second cylindrical cavity with a second diameter, the first diameter being smaller than the second diameter.

11. The method of claim 1, wherein the first and second cavities are cylindrical, and both cylindrical cavities have a substantially similar aspect ratio.

12. The method of claim 1, wherein the first cavity and the second cavity are etched using a dry etching process.

13. A method for fabricating a semiconductor device with an in-substrate co-axial capacitor coupled to an active circuit layer and a power plane, the substrate having a first surface and a second surface, the method comprising:
   forming an active circuit layer adjacent the first surface of the substrate; etching a first cavity into the active circuit layer and the first surface of the substrate to a first depth, the first cavity having a first outer wall with a first perimeter;
   etching a second cavity into the second surface of the substrate to a second depth, the second cavity having a second outer wall with a second perimeter, the first and second cavities forming a single continuous aperture through the substrate;
   depositing a first conductive material layer on the first outer wall and the second outer wall such that the first conductive material layer is electrically continuous across a length of the aperture;
   depositing an isolation material layer on the first conductive material layer;
   depositing a second conductive material layer on the isolation material layer such that the second conductive material layer is electrically continuous across the length of the via hole, the first and second conductive material layers and the isolation material layer forming an in-substrate capacitor;
   forming a power plane adjacent the second surface of the substrate; and electrically coupling the active circuit layer and the power plane to the in-substrate co-axial capacitor to provide power conditioning to the active circuit layer.

* * * * *